United States Patent [19]
Dennison

[11] Patent Number: 5,340,763
[45] Date of Patent: Aug. 23, 1994

[54] MULTI-PIN STACKED CAPACITOR UTILIZING MICRO VILLUS PATTERNING IN A CONTAINER CELL AND METHOD TO FABRICATE SAME

[75] Inventor: Charles H. Dennison, Boise, Id.

[73] Assignee: Micron Semiconductor, Inc., Boise, Id.

[21] Appl. No.: 17,067

[22] Filed: Feb. 12, 1993

[51] Int. Cl.$^5$ .................. H01L 21/70; H01L 27/00
[52] U.S. Cl. ................................. 437/52; 437/60; 437/919
[58] Field of Search ................ 437/47, 52, 60, 919

[56] References Cited

U.S. PATENT DOCUMENTS

| | | | |
|---|---|---|---|
| 5,061,650 | 10/1991 | Dennison et al. | 437 et al./47 |
| 5,126,280 | 6/1992 | Chan et al. | 437/52 |
| 5,134,086 | 7/1992 | Ahn | 437/52 |
| 5,158,905 | 10/1992 | Ahn | 437/52 |
| 5,162,248 | 11/1992 | Dennison et al. | 437/52 |
| 5,164,881 | 11/1992 | Ahn et al. | 437/52 |
| 5,227,322 | 7/1993 | Ko et al. | 437/47 |

OTHER PUBLICATIONS

"Micro Villus Patterning (MVP) Technology For 256Mb DRAM Stack Cell", by J. H. Ahn et al., 1992 Symposium on VLSI Technology Digest . . . , pp. 12-13.

*Primary Examiner*—Olik Chaudhuri
*Assistant Examiner*—H. Jey Tsai
*Attorney, Agent, or Firm*—David J. Paul

[57] ABSTRACT

The present invention provides production repeatable process to form polysilicon storage node structures using MVP technology. The storage node is formed over word lines beginning with a deposition and planarization of an insulator or composite insulator. A contact/container photo and etch creates a contact/container opening to provide access to the underlying active area either directly or through a conductive plug. After the contact/container opening is formed, an insitu doped polysilicon layer is deposited and planarized to completely fill contact/container opening while isolating adjacent storage nodes from one another. Next an oxide layer is deposited and is followed by deposition of HSG poly. Then a plasma poly etch of the HSG poly is performed that is followed by a plasma oxide etch. After these steps, a timed poly etch is performed long enough to sufficiently transfer an 'archipelago' pattern to storage node poly. Transferring of the 'archipelago' pattern to poly produces very thin poly villus bars (or pins) to form a multi-pin storage node poly structure of the present invention. Finally a cell dielectric is deposited over the storage node poly and is followed by a deposition of a conductive material to form the second capacitor electrode. Conventional process steps are preformed from this point on to complete the semiconductor device.

4 Claims, 7 Drawing Sheets

MULTI-PIN STACKED CAPACITOR UTILIZING MICRO VILLUS PATTERNING IN A CONTAINER CELL AND METHOD TO FABRICATE SAME

FIELD OF THE INVENTION

This invention relates to semiconductor circuit memory storage devices and more particularly to a process for fabricating three-dimensional stacked cell capacitors used in high-density dynamic random access memory (DRAM) arrays.

1. Related Applications

This application is related to pending application Ser. No. 947,523, filed Sep. 18, 1992 now U.S. Pat. No. 5,292,677.

2. Background of the Invention

In dynamic semiconductor memory storage devices it is essential that storage node capacitor cell plates be large enough to retain an adequate charge. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if uture generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

A paper submitted by J. H. Ahn et al., entitled "Micro Villus Patterning (MVP) Technology for 256Mb DRAM Stack Cell," 1992 IEEE, 1992 Symposium on VLSI Technology Digest of Technical Papers, pp. 12–13, herein incorporated by reference, discusses MVP (Micro Villus Patterning) technology to develop a 3-dimensional stacked capacitor having vertical villus bars fabricated into the storage node cell plate.

Figure 1:
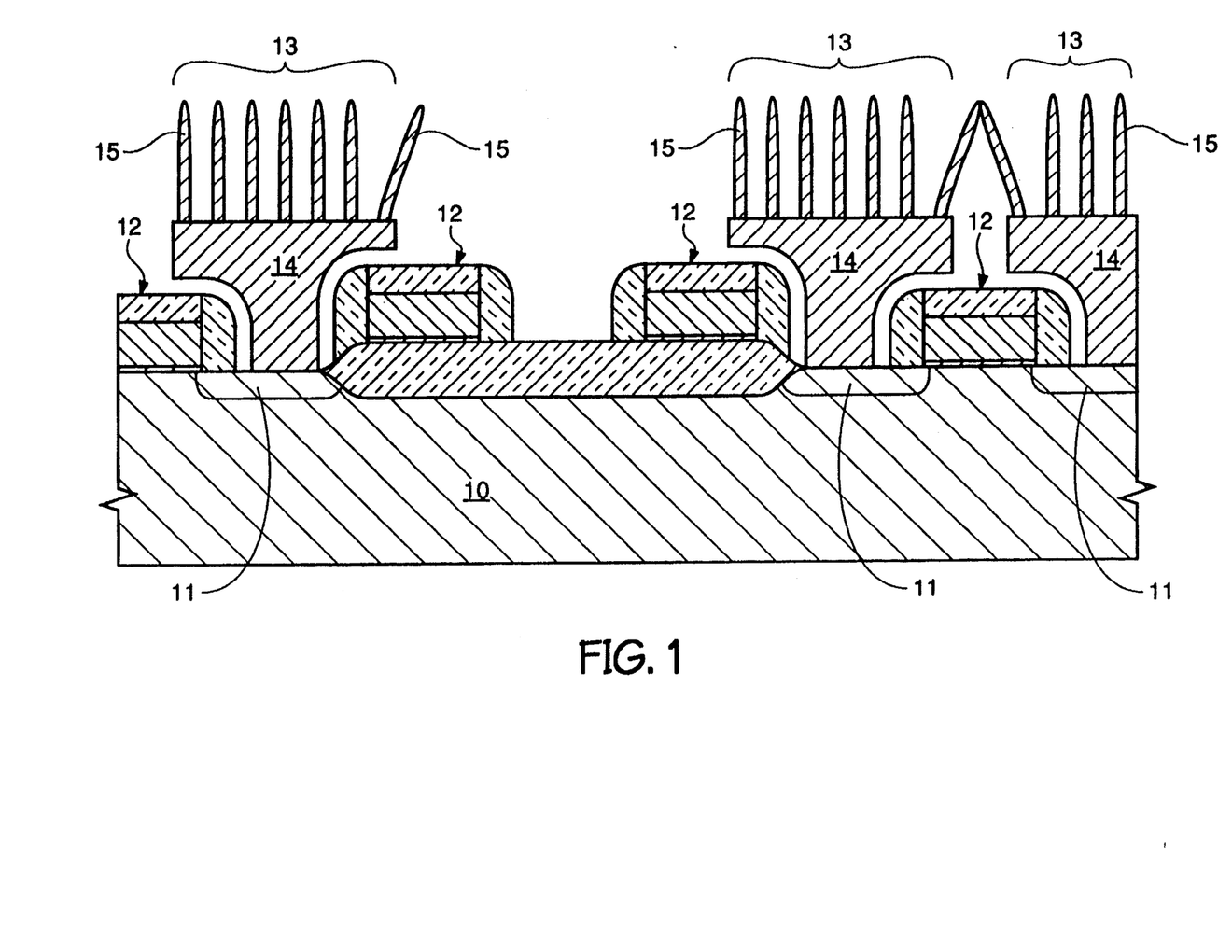
FIG. 1 is a cross-sectional view of a polysilicon storage node developed by using micro villus technology.

However, using MVP technology may result in splintering problems (or slivers) in the storage node poly when using MVP to form 3-dimensional stacked capacitors as described by the above reference. As shown in FIG. 1, a cross-section of parallel words 12 have been fabricated onto a silicon wafer 10. Storage nodes 13 (making contact to active areas 11) have been formed from storage node poly 14 and poly micro villus bars/pins 15. As shown in this cross-section, the micro villus bars/pins 15 are susceptible to splintering that may result in poly slivers falling over and shorting to an adjacent storage node poly, which would render the adjacent storage cells shorted and unusable. Furthermore, when using HSG (Hemispherical-Grain) poly, as is done in FIG. 1, the variable grain size results in variable pin diameters with a percentage of these pins having diameters less than 0.0100 $\mu$m which are more susceptible to breaking and splintering.

In a 64M DRAM for example, even if there were only one out of 100,000 cells that had a short due to such splintering this would lead to a 640 random failures in the 64M DRAM which is more failures then could be repaired. Because there is a limited number of redundant elements available for repair the entire memory device would be unusable. It is therefore desirable to increase storage cell capacitance by using such technologies as MVP while eliminating polysilicon storage node splintering problems.

U.S. Pat. Nos. 5,162,248 and 5,061,650 are herein incorporated by reference as they disclose methods of forming container storage node cells.

SUMMARY OF THE INVENTION

The present invention develops conductive structures that can be utilized for storage node electrodes for storage cells with a first embodiment comprises the fabrication of a multi-pin conductive structure on a starting substrate's existing topography, by the steps of:

forming a blanketing first insulating layer over the existing topography;

patterning and etching an opening into the first insulating layer to form a container form;

forming and planarizing a first conductive layer to fill the container form and thereby isolating adjacent storage nodes;

forming a blanketing second insulating layer over the first conductive and the first insulating layers;

forming a rugged surface over the second insulating layer;

transferring an archipelago pattern to the first planarized conductive layer; and forming villus bars into the first conductive layer which results in the formation of the multi-pin conductive structure.

A second embodiment of the present invention comprises the fabricating of a multi-pin conductive container structure on a starting substrate's existing topography, using the steps of:

forming a blanketing first insulating layer over the existing topography;

patterning and etching an opening into the first insulating layer to form a container form;

forming and planarizing a first conductive layer to fill the container form;

recessing the planarized first conductive layer;

forming a blanketing second insulating layer over the first conductive and the first insulating layers;

forming insulating spacers on the recessed edges of the first conductive layer;

forming a rugged surfaced layer over the second insulating layer;

transferring an archipelago pattern to the first planarized conductive layer; and forming villus bars to form multi-pins residing inside the conductive container structure.

A third embodiment of the present invention comprises fabricating a multi-container conductive container structure on a starting substrate's existing topography, using the steps of:

forming a blanketing first insulating layer over the existing topography;

patterning and etching an opening into the first insulating layer, said opening to form a container form;

forming and planarizing a first conductive material to fill the container form;

recessing the planarized first conductive material;

forming alternating insulating spacers and conductive spacers on the recessed surface of the first conductive material; and removing the multiple conductive spacers and trenching into the underlying first conductive material to form the multiple container structure.

DETAILED DESCRIPTION OF THE INVENTION

The presented invention is directed to maximizing storage cell surface area in a high density/high volume DRAM fabrication process, as shown in FIGS. 2-10.

A silicon wafer is prepared using conventional process steps up to the point of defining a capacitor cell. At this point, fabrication of word lines, associated active areas and optionally digit lines for a capacitor over digit line flow have been completed (the invention can also apply to STC cells with capacitor below digit line flows). The process steps of the various embodiments of the present invention will now follow.

Figure 2:
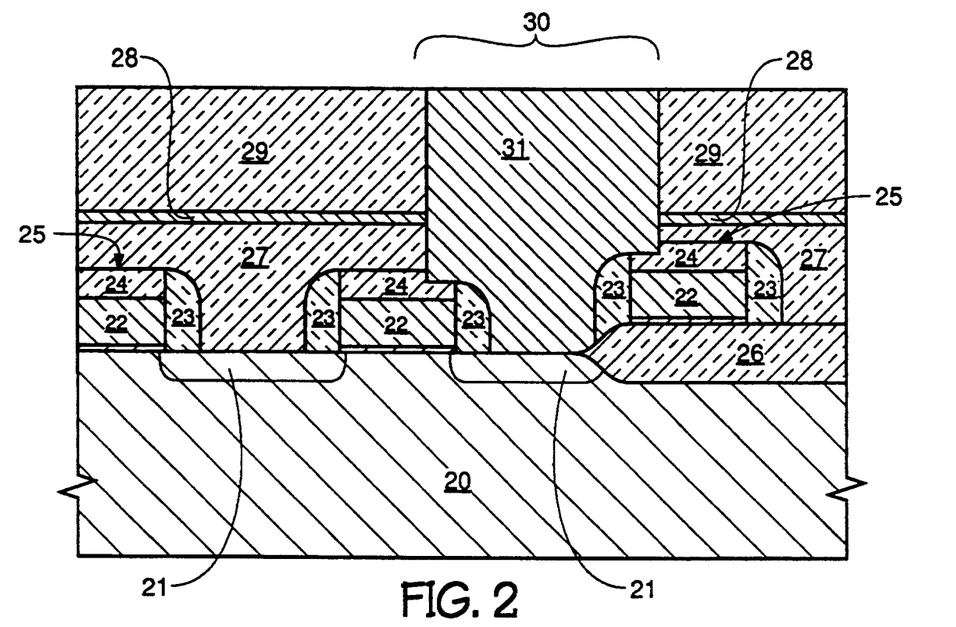
FIGS. 2-4 are cross-sectional views depicting the results of process steps performed in a first embodiment of the present invention.
Figure 3:
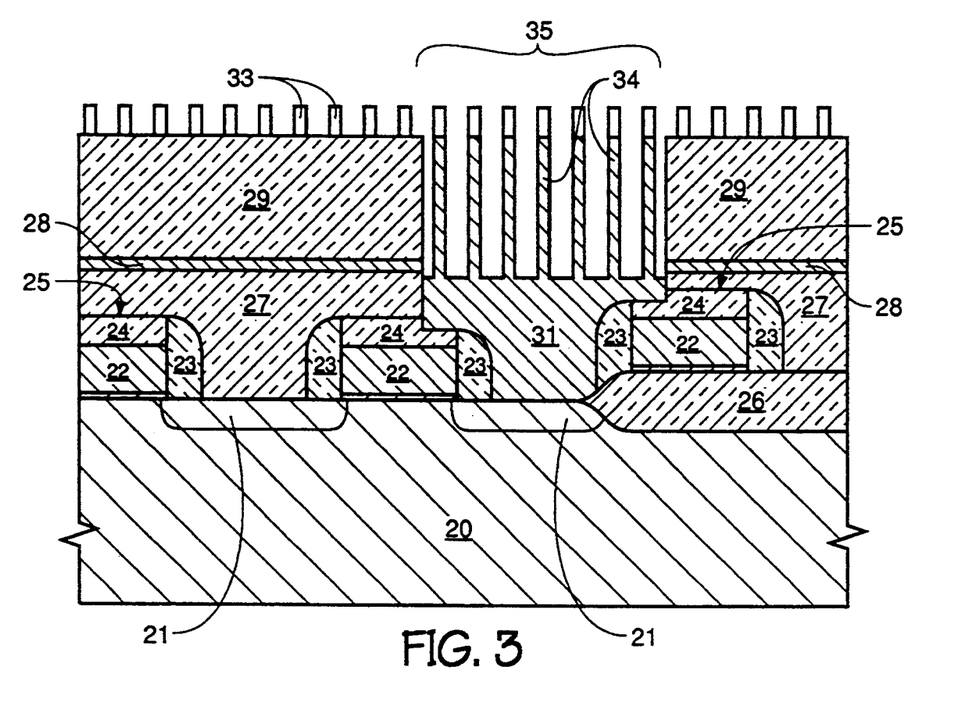
Figure 4:
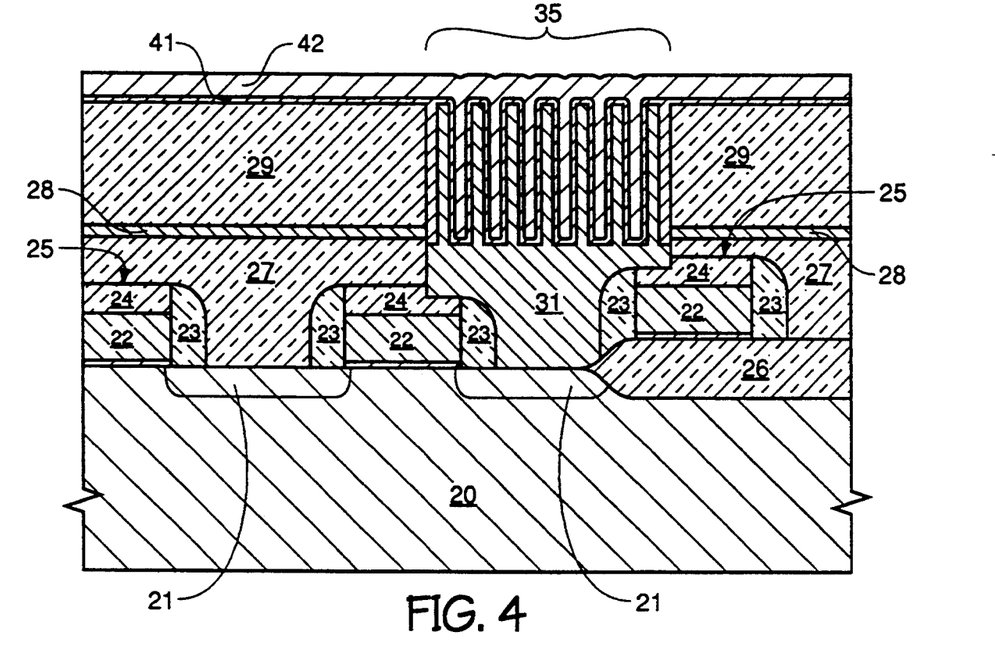
Figure 5:
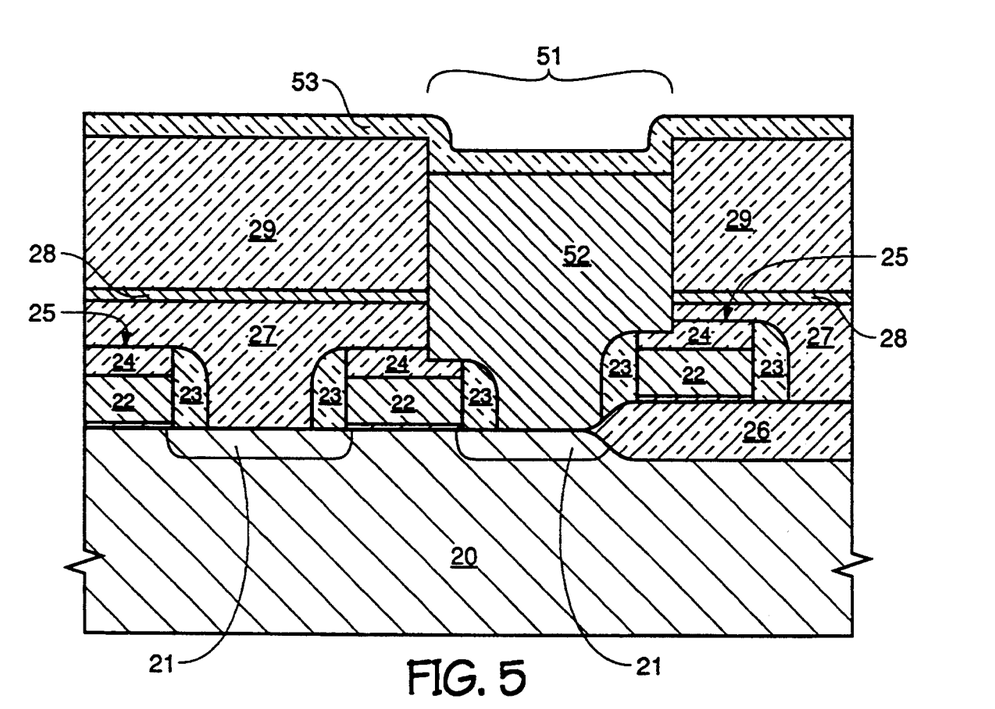
FIGS. 5, 5A, 5B, 6, 7 are cross-sectional views depicting the results of process steps performed in a second embodiment of the present invention.
Figure 5A:
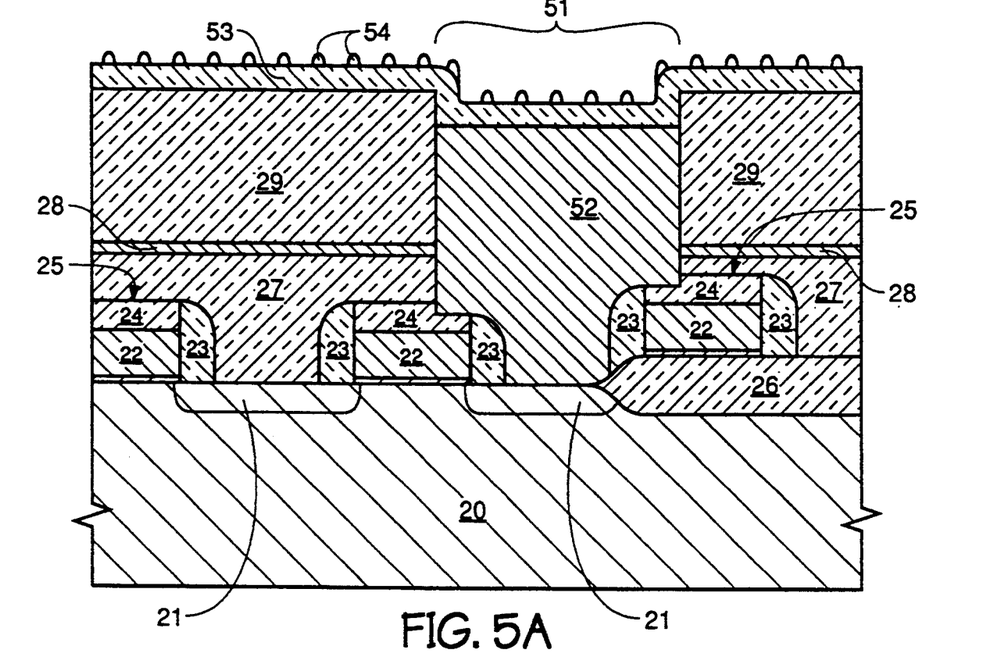
Figure 5B:
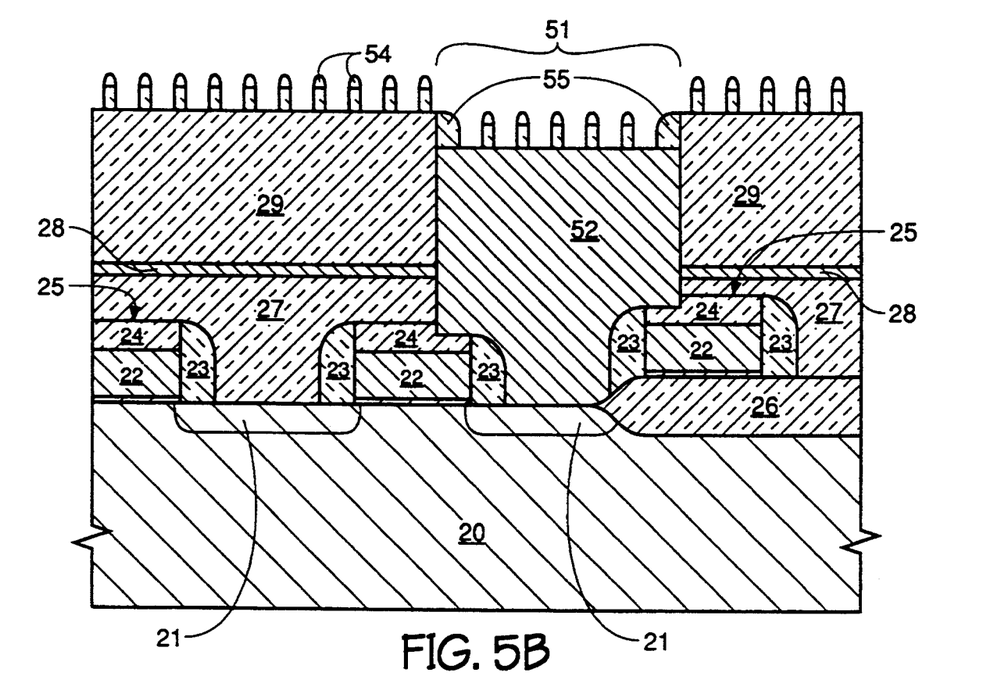
Figure 6:
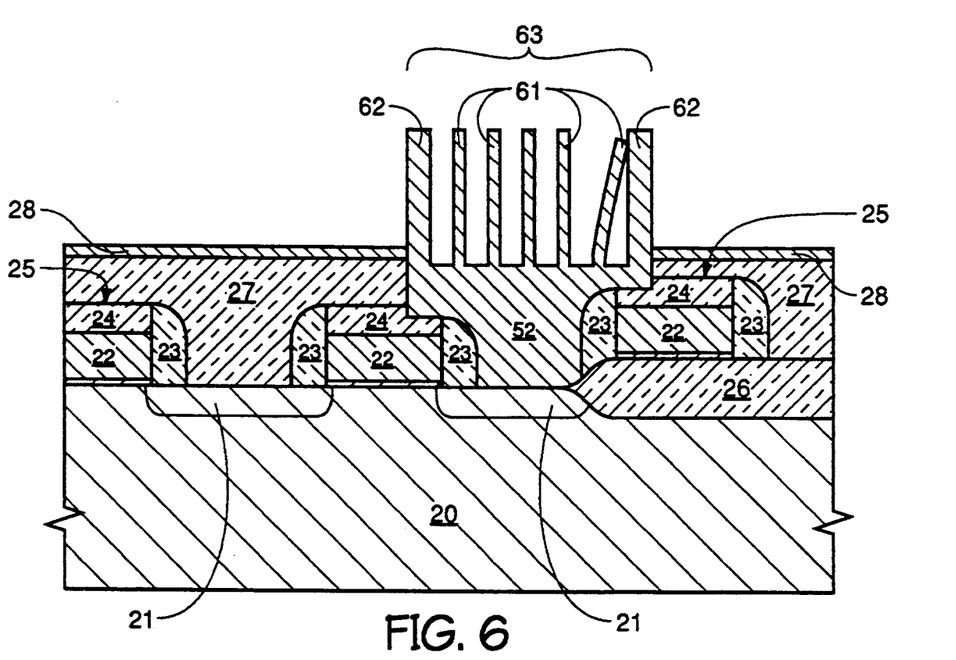
Figure 7:
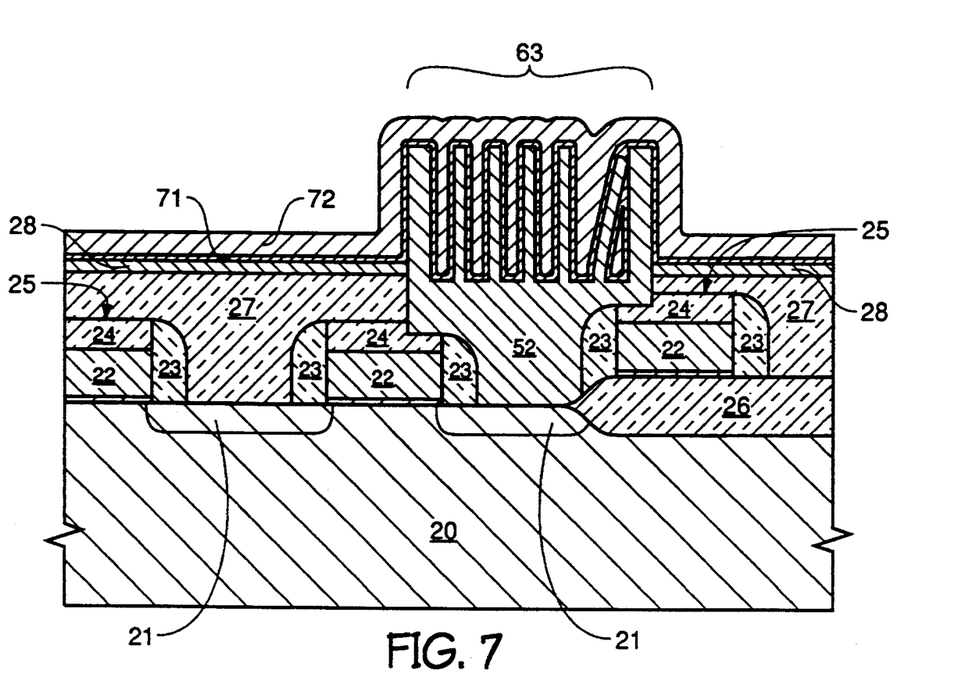
Figure 8:
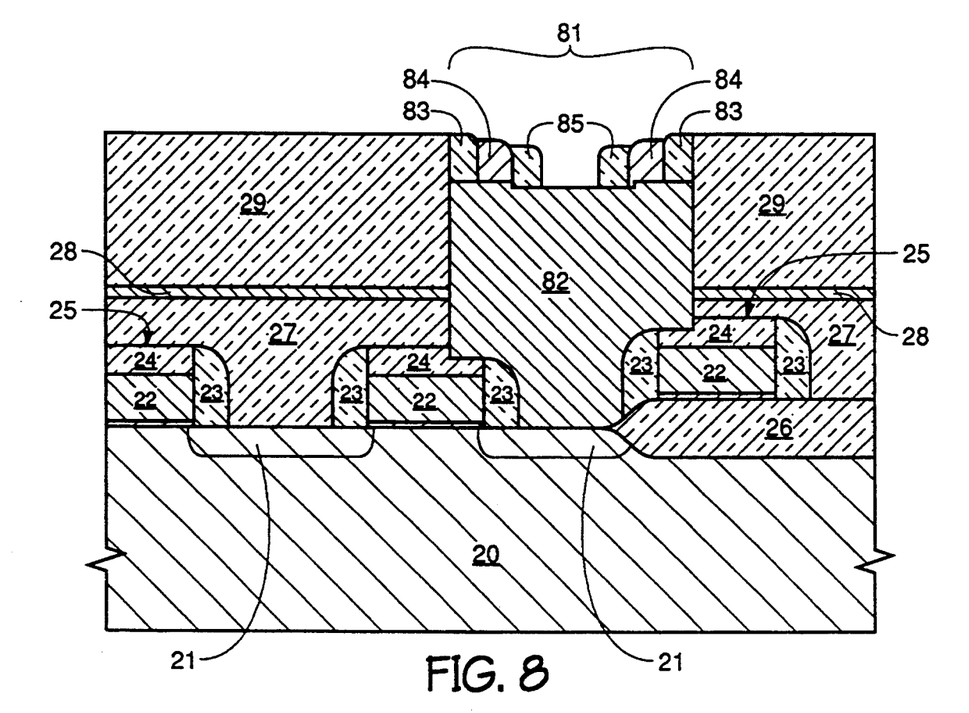
FIGS. 8-10 are cross-sectional views depicting the results of process steps performed in a third embodiment of the present invention.
Figure 9:
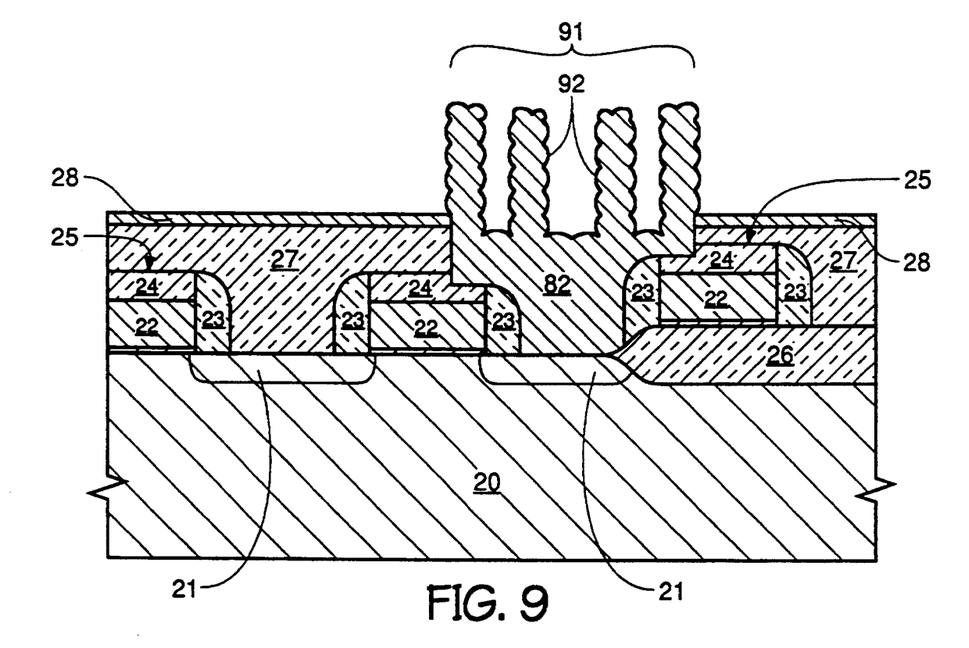
Figure 10:
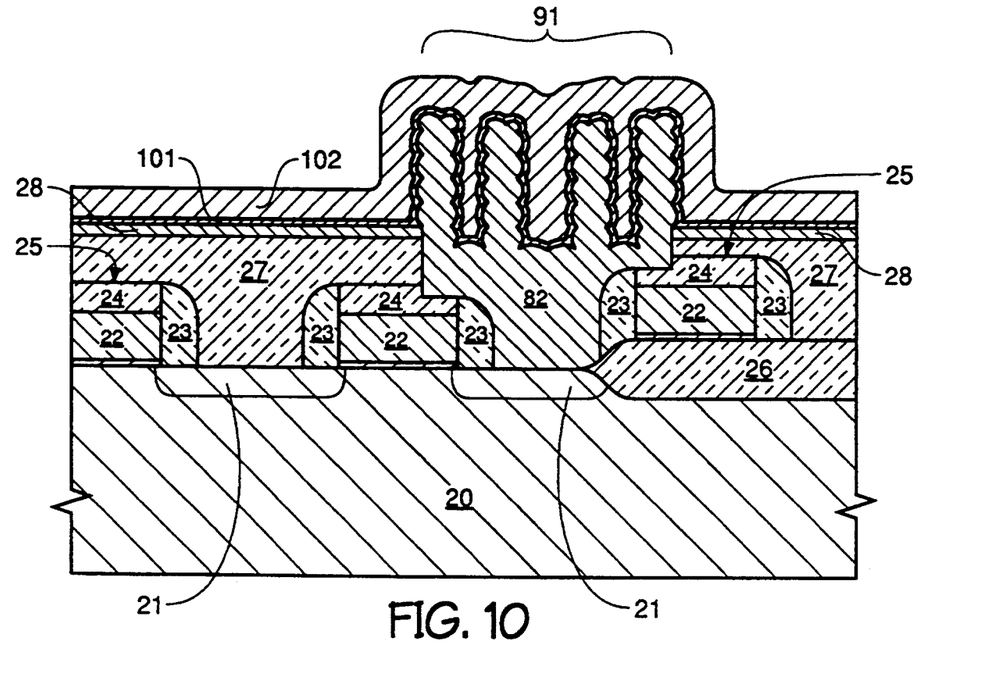

FIGS. 2-10 show three embodiments depicting process steps of the present invention seen in a series of cross-sectional views taken across parallel word lines. FIGS. 2-4 depict a first embodiment, FIGS. 5-7 depict a second embodiment and FIGS. 8-10 depict a third embodiment (which is also the preferred embodiment), all of which will be described as seen from a word line cross-sectional view.

Referring now to FIG. 2 of the first embodiment, word lines 25 span between active areas 21 that have been formed into substrate 20 thereby forming active transistors. Word lines 25 comprise a conductive layer 22 covered with dielectric 24 and surrounded by dielectric spacers 23. Dielectric 27 has been deposited and planarized and followed by a deposition of dielectric layer 28 (nitride or a low wet etch rate oxide is preferred). A layer of dielectric material 29 (oxide or a high wet etch rate oxide, such as BPSG, is preferred) has been deposited and planarized, followed by a contact/container photo and etch to create contact/container opening 30, thus providing access to active area 21. If so desired, a single layer 27 of thick dielectric material can be deposited for layers 27, 28 and 29. After contact/container opening 30 has been formed, an insitu doped polysilicon layer 31 is deposited to completely fill contact/container opening 30. Poly 31 is then planarized (preferably by chemical mechanical planarization) to isolate the adjacent storage nodes from one another.

Referring now to FIG. 3, a hard etch mask is provided by the deposition of an oxide layer 33 (~0.05μ thick) which is followed by deposition of HSG poly. To complete the mask, a partial plasma poly etch of HSG poly is performed to transfer a rugged surface to the underlying oxide which is then followed by a plasma oxide etch of oxide 33. After the hard etch mask is formed, a timed poly etch is performed long enough to sufficiently transfer an 'archipelago' pattern (seen in FIG. 3) to storage poly 31. Transferring of the 'archipelago' pattern to poly 31 produces very thin poly villus bars 34 (or pins) to form a multi-pin storage node poly structure 35 of the present invention.

Referring now to FIG. 4, cell dielectric 41 is deposited over storage node poly 35 followed by a poly 42 deposition to form the second capacitor electrode. Conventional process steps are preformed from this point on to complete the semiconductor device.

In a second embodiment and referring now to FIG. 5, word lines 25 span between active areas 21 that have been formed into substrate 20 thereby forming active transistors. Word lines 25 comprise a conductive layer 22 covered with dielectric 24 and surrounded by dielectric spacers 23. Dielectric 27 has been deposited and planarized followed by deposition of dielectric layer 28 (nitride is preferred). A layer of dielectric material 29 (oxide is preferred) has been deposited and planarized, followed by a contact/container photo and etch to create contact/container opening 51, thus providing access to active area 21. After contact/container opening 51 has been formed, an insitu doped polysilicon layer 52 is deposited to completely fill contact/container opening 51. Poly 52 is then planarized (preferably by chemical mechanical planarization) to isolate the adjacent storage nodes from one another. Next poly 52 is etched to recess its planarized surface below the planarized surface of oxide 29. Then a deposition of oxide layer 53 (~0.1μ thick) is performed to coat oxide 29 and recessed poly 52.

Referring now to FIG. 5A, a layer of HSG poly 54 is deposited and then partially etched using a plasma poly etch of HSG poly 54 to thereby leaving a rugged surfaced poly over oxide 53.

Referring now to FIG. 5B, in order to transfer the rugged surface to the underlying oxide layer 53, a plasma oxide etch is performed. The plasma oxide etch of oxide layer 53 not only transfers the rugged surface to oxide 53, but it also forms oxide spacers 55.

Referring now to FIG. 6, a timed poly etch is performed long enough to sufficiently transfer an 'archipelago' pattern to poly 52. It is important that the oxide etch prior to the timed poly etch must also be timed such that the oxide etch doesn't penetrate through the spacer oxide. Transferring of the "archipelago pattern to poly 52 produces very thin poly villus bars 61 (or pins) to form a multi-pin storage node poly structure 63. Also, a continuous poly container 62 is formed that surrounds villus bars 61 to will prevent any of the thin poly villus bars from falling over and shorting to any adjacent cells of the present invention. Next, an optional hydrofluoric (HF) based etch can be performed to gain the outer area of the storage node to increase surface area.

Referring now to FIG. 7, cell dielectric 71 is deposited over storage node poly 63 followed by a poly 72 deposition to form the second capacitor electrode. Conventional process steps are preformed from this point on to complete the semiconductor device.

In the preferred embodiment and referring now to FIG. 8, word lines 25 span between active areas 21 that have been formed into substrate 20 thereby forming active transistors. Word lines 25 comprise a conductive layer 22 covered with dielectric 24 and surrounded by dielectric spacers 23. Dielectric 27 has been deposited and planarized followed by deposition of dielectric layer 28 (nitride is preferred). A layer of dielectric material 29 (oxide is preferred) has been deposited and planarized, followed by a contact/container photo and etch to create contact/container opening 81, thus providing access to active area 21. After contact/container opening 81 has been formed an insitu doped polysilicon layer 82 is deposited to completely fill contact/container opening 81. Poly 82 is then planarized (preferably by chemical mechanical planarization) to isolate the adjacent storage nodes from one another. Next poly 82 is etched to recess its planarized surface below ($\sim 0.2\mu$) the planarized surface of oxide 29. Then a deposition of oxide ($\sim 0.06$–$0.10\mu$ thick) is performed and oxide spacers 83 are formed from a subsequent spacer etch. Next a deposition of poly ($\sim 0.06$–$0.15\mu$ thick) is performed and poly spacers 84 are formed from a subsequent spacer etch. Then a second deposition of oxide ($\sim 0.10\mu$ thick) is performed and oxide spacers 85 are formed from a subsequent spacer etch. At this point, if so desired, multiple poly spacers (each being separated by oxide spacers) can be formed that will result in multiple (i.e. dual, triple, etc.) containers in the storage node poly 91 (as seen in Figure) after a long poly etch is performed.

Referring now to FIG. 9, an etch of oxide 29 is performed to expose the outer walls of dual storage node container 91. It is also an option at this point to either leave the storage node poly as it is or to deposit a layer of HSG poly. If the HSG poly is deposited, a blanket etch of the HSG poly follows that results in the formation of HSG poly 92 (texturized or rugged poly) about the storage node poly container 91.

Referring now to FIG. 10, cell dielectric 101 is deposited over storage node container poly 91 followed by a poly 102 deposition to form the second capacitor electrode. Conventional process steps are preformed from this point on to complete the semiconductor device.

Although the preferred cell dielectric is nitride, any material having a high dielectric constant, such as $Ta_2O_5$ or $SrTiO_3$, could be used. As is the case for all embodiments of the present invention and any alterations thereof, the poly deposited to form the second cell plate of the capacitor is conductively doped either n-type or p-type depending on the conductivity type desired for active area 21. Conventional process steps are preformed from this point on to complete the semiconductor device.

It is to be understood that although the present invention has been described with reference to a preferred embodiment, various modifications, known to those skilled in the art, may be made to the structures and process steps presented herein without departing from the invention as recited in the several claims appended hereto.

What is claimed is:

1. A process for fabricating a mutli-pin conductive structure on a starting substrate's existing topography, said process comprising the steps of:
    a) forming blanketing first, second and third insulating layers over said existing topography;
    b) patterning and etching an opening into said first, second and third insulating layers;
    c) forming and planarizing a conductive material thereby filling said opening;
    d) recessing said planarized conductive material;
    e) removing said third insulating layer thereby exposing the outer walls of said conductive material;
    f) forming alternating insulating spacers and conductive spacers on the recessed surface of said conductive material; and
    g) removing said conductive spacers and trenching into the underlying conductive material thereby forming said multi-pin structure.

2. A process as recited in claim 1, wherein additional steps are performed between steps "f" and "g," said additional steps comprising:
    removing said first insulating layer thereby exposing the outer walls of said first conductive material;
    forming a second conductive layer on said exposed walls of said conductive material and the exposed surfaces of said structure;
    forming a texturized surface on said second conductive layer, said texturized surface adhering to said conductive material.

3. A process as recited in claim 2, wherein said forming of said conducting material comprises depositing an insitu doped polysilicon layer, said forming of said second conducting layer comprises depositing HSG polysilicon, and forming of said third insulating layer comprises forming an oxide layer.

4. A process as recited in claim 1, wherein said planarization of said conductive layer comprises chemical mechanical planarization.

* * * * *